(12) United States Patent
Dietrich et al.

(10) Patent No.: US 6,778,623 B1
(45) Date of Patent: Aug. 17, 2004

(54) APPARATUS FOR SYNCHRONIZING THE FRAME CLOCK IN UNITS/NODES OF DATA-TRANSMITTING SYSTEMS

(75) Inventors: Werner Dietrich, Vienna (AT); Wilhelm Hoschek, Fischamend (AT)

(73) Assignee: Siemens Aktiengesellschaft, Munich (DE)

( * ) Notice: Subject to any disclaimer, the term of this patent is extended or adjusted under 35 U.S.C. 154(b) by 608 days.

(21) Appl. No.: 09/677,313

(22) Filed: Sep. 29, 2000

(30) Foreign Application Priority Data

Sep. 30, 1999 (DE) ........................................ 199 47 095

(51) Int. Cl.$^7$ ................................................ H03D 3/24
(52) U.S. Cl. ....................... 375/376; 327/156; 327/147
(58) Field of Search ................................ 327/115, 142, 327/156, 147; 370/503, 508; 331/14, 51, 12, 16, 1 A; 375/376, 371; 455/260

(56) References Cited

U.S. PATENT DOCUMENTS

| | | | | |
|---|---|---|---|---|
| 4,679,004 A | * | 7/1987 | Takahara et al. | 331/14 |
| 5,490,147 A | | 2/1996 | Kubo | |
| 5,661,440 A | * | 8/1997 | Osaka | 331/16 |
| 5,729,179 A | * | 3/1998 | Sumi | 331/12 |
| 5,818,303 A | * | 10/1998 | Oishi et al. | 331/1 A |
| 5,847,611 A | * | 12/1998 | Hirata | 331/1 A |
| 5,923,669 A | | 7/1999 | Chopping | |
| 6,002,278 A | * | 12/1999 | Saito | 327/115 |
| 6,140,851 A | * | 10/2000 | Akita | 327/156 |

FOREIGN PATENT DOCUMENTS

EP 0 014 945 9/1980

* cited by examiner

Primary Examiner—Mohammad H. Ghayour
Assistant Examiner—Aradom B. Merid
(74) Attorney, Agent, or Firm—Shaw Pittman LLP

(57) ABSTRACT

In data transmitting systems, an apparatus for synchronizing the frame clock in units/nodes. The apparatus has a phase detector and a voltage controlled oscillator. At least one input of the phase detector is supplied with an incoming clock signal and another input is supplied with an output signal of the voltage controlled oscillator. The output signal of the voltage controlled oscillator is conducted over a divider, which is connected to a frame clock phase detector for setting its division factor. The frame clock phase detector is supplied with an input frame clock, the output of the variable divider, and at least one output of an output divider. The at least one output of the output divider divides the output signal of the controlled oscillator into the output frame clock. The frame clock phase detector is configured for the output of a pulse that temporarily raises or lowers the division factor of the divider when the phase difference between input and output clock deviates from a prescribable quantity.

11 Claims, 5 Drawing Sheets

APPARATUS FOR SYNCHRONIZING THE FRAME CLOCK IN UNITS/NODES OF DATA-TRANSMITTING SYSTEMS

BACKGROUND OF THE INVENTION

1. Field of the Invention

The present invention generally belongs to the field of data transmitting system frame clock synchronization. In particular, the present invention belongs to the field of synchronizing the frame clock in units/nodes of data transmitting systems.

2. Discussion of the Related Art

In many data transmission systems, a basic structure of the data transmission is built up by a frame clock signal, for example in SDH systems (SDH=synchronous digital hierarchy). What are to be understood by "data", of course, are arbitrary digital data, including audio and video data or, respectively, signals. The data embedded in the frames are transmitted with the clock frequency that amounts to a multiple of the frame clock and that has a whole-numbered, rigid frequency and phase relationship to the frame clock. A frame clock that is often employed in practice amounts to 8 kHz and the clock frequency amounts to 2.048 MHz, corresponding to a ratio of 1:256. The basic structure "frame clock— clock frequency" must be maintained in a data processing in order to avoid large buffer memories.

In the example under consideration, exactly 256 data bits lie between two leading edges of the 8 kHz frame clock. When the clock frequency 2.048 MHz deviates slightly from the rated value due to a disturbance, then a frequency deviation also occurs in the 8 kHz due to the coupling of the two clocks, so that exactly 256 bits again lie in a frame clock period. This relationship must always be preserved. This is assured in the data transmission by what is referred to as the frame identifier word that is sent every 256 bits. The 2.048 MHz clock is generated from the data and the 8 kHz clock is derived from the frame identifier word. The position of the individual data channels that are merged to form the 2.048 Mbit/s data stream can in turn be identified from the position of the individual data channels.

When the 2.048 MHz clock frequency of the incoming data stream is employed as comparison frequency for synchronization given a clock regeneration in, for example, a network node with the assistance of a phase locked loop, abbreviated as PLL, then an 8 kHz signal derived from the regenerated clock can have 256 different positions relative to the frame identifier word of the incoming data stream, only one single instance thereof correctly indicating the frame start. The 8 kHz frequency acquired from the frame identifier word is therefore employed as comparison frequency and the relationship to the frame identifier word is thereby automatically obtained.

FIG. 1 shows a schematic circuit of the Prior Art with whose assistance the frame clock $f_R'$ of outgoing signals is synchronized to the frame clock $f_R$ of incoming signals. The phase locked loop PLL is thereby composed of a phase detector PHD, a filter FIL, a voltage-controlled oscillator VCO and a divider DIV. In order to stick with said example, the oscillator VCO supplies a frequency $f_T'$ of 2.048 MHz for the output clock. This frequency $f_T'$ is divided onto 8 kHz in the divider DIV in the ratio 256:1 and is supplied to an input of the phase detector, at whose other input the frame clock $f_R$ of the incoming signals is adjacent.

The divider DIV must be a synchronous divider; as a result thereof, the 8 kHz signal edge nearly coincides with a signal edge of the 2.048 MHz clock. The relative phase position of the 8 kHz clocks is defined by the selection of the phase detector PHD. An EX-OR phase detector causes a 90° phase shift; however, a slight asymmetry in the reference voltage can already cause significant phase deviations with reference to 2.048 MHz. Given outage of the reference signal, the last frequency is therefore approximately maintained for some time. Other known phase detector circuits that synchronize to 0 phase difference are, of course, more favorable with respect to the phase difference but, given outage of the reference signal, have the property of immediately greatly detuning the clock output in terms of frequency, often up to the frequency limits of the oscillator VCO.

The circuit according to FIG. 1 of the Prior Art has a number of disadvantages:

a) Insofar as it lies in the proximity of the frame clock—8 kHz—or a multiple thereof, the jitter of the frame clock signal $f_R$ is mixed down into the region of 0 Hz by mixed products at the phase detector and can then no longer be filtered out in following phase locked loops, whereby an inadmissibly high jitter accumulation can occur over the course of a data transmission link with a corresponding serial connection of phase locked loops.

b) A high filter gain is required in the loop, which in turn produces a great sensitivity to voltage fluctuations and noise voltages.

c) As mentioned above, signal disturbances at the input can lead to great frequency and voltage fluctuations.

SUMMARY OF THE INVENTION

It is an object of the present invention to provide a synchronization circuit wherein the clock derived from the data exhibits a multiple clock frequency compared to the frame clock.

It is another object of the invention to provide a synchronization circuit wherein the divider is fashioned as an adjustable divider with an adjustable division factor, It is a further object of the invention to provide a synchronization circuit wherein a divider is connected to a frame clock phase detector for setting its division factor.

It is an additional object of the invention to provide a synchronization circuit that enables a fast resynchronization given disturbances and yields a drastic reduction of jitter.

It is yet another object of the invention to provide a synchronization circuit wherein a frame clock phase detector configured for output of a pulse that temporarily raises or lowers the division factor of the divider dependent on the maximum phase jitter of the clocks if the frame clocks deviate.

It is yet a further object of the invention to provide a synchronization circuit wherein a frame clock phase detector is supplied with the input frame clock, the These and other objects of the invention will become apparent upon careful review of the detailed description of the preferred embodiments which is to be read in conjunction with review of the accompanying drawing figures.

DETAILED DESCRIPTION OF THE PREFERRED EMBODIMENTS

Figure 1:
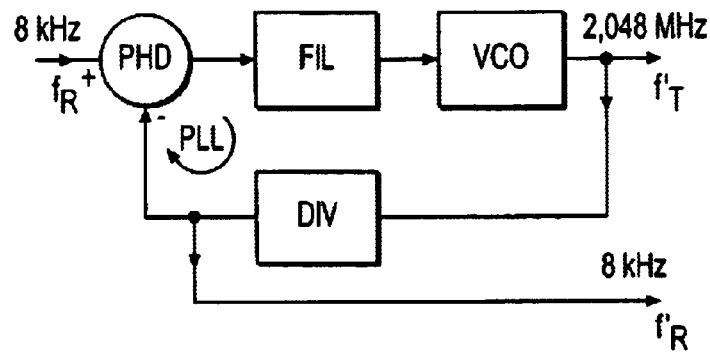
FIG. 1 shows a phase locked loop for frame clock synchronization according to the Prior Art.
Figure 2A:
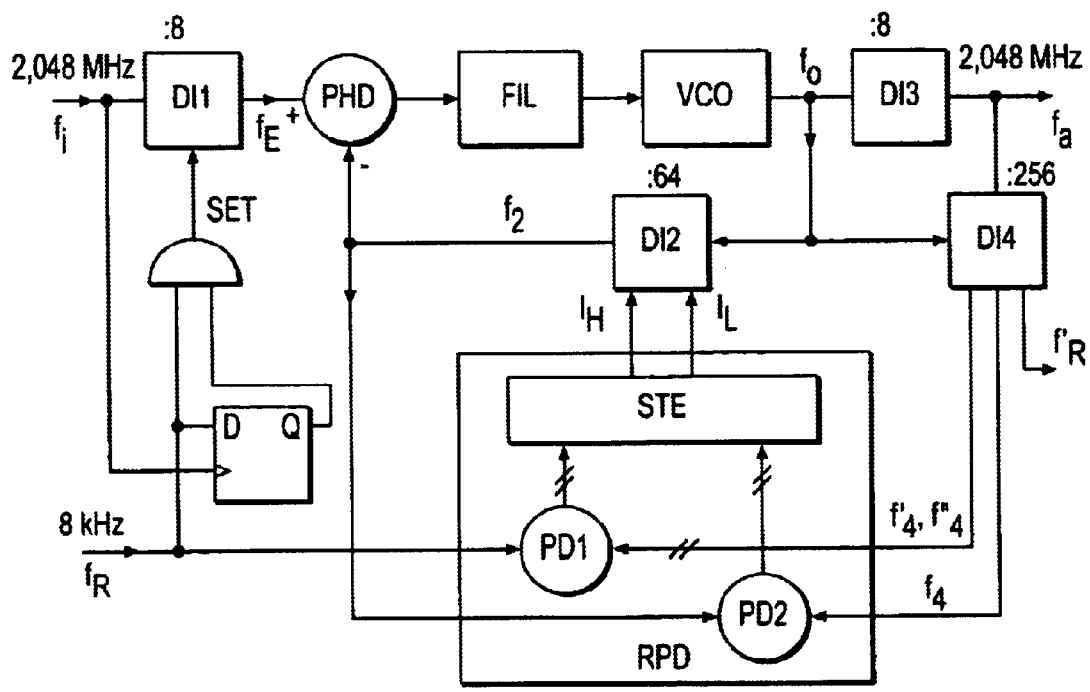
FIG. 2a shows an apparatus for frame clock synchronization according to the present invention.

Turning now to FIG. 2a, which shows expanded functions with an auxiliary for the synchronization of the frame clock, 8 kHz. The circuit is supplied with an input pilot signal $F_1$, 2.048 MHz, and with the input frame clock $f_R$, 8 kHz. The output pilot clock is referenced $f_a$ and the output frame clock is referenced $f_R'$. The circuit has an input divider DI1 that divides the input pilot clock $f_I$, of 2.048 MHz onto 256 kHz. This clock, referenced $f_E$, is supplied to a phase detector PHD. This phase detector PHD is followed by a filter FIL whose output controls a voltage-controlled oscillator VCO with an output frequency $f_0$. The output frequency $f_0$ of the voltage-controlled oscillator VCO is supplied to the phase detector PHD as signal $f_2$ via a oscillator VOC with an output frequency $f_0$. The output frequency $f_0$ of the voltage-controlled oscillator VCO is supplied to the phase detector PHD as signal $f_2$ via a specifically controlled divider DI2 that divides by 64. The output signal of the voltage-controlled oscillator VCO oscillating at a frequency of 16.384 MHz is divided by 8 in a divider DI3 onto the output clock $f_a$ with 2.048 MHz, and this signal is divided farther by an output divider DI4 onto the output frame clock $f_R'$. This output divider is synchronized by the output signal $f_0$ of the voltage-controlled oscillator VCO.

A frame clock phase detector RPD is provided for controlling the controlled divider, this detector RPD in turn containing two phase discriminators PD1 and PD2 whose output signals drive the divider DI2 via a logic unit STE. The phase discriminator PD1 is supplied, on the one hand, with the input frame clock $f_R$ and, on the other hand, with two clock $f_4'$ and $f_4''$, whereby these clocks are phase-locked with the output frame clock $f_R'$ but shifted relative to this clock. The phase discriminator PD2 is supplied, on the one hand, with the output clock $f_2$ of the controlled divider DI2 and, on the other hand, with an output clock $f_4$ of the output divider DI4. This clock is also phase-locked with the output frame clock $f_R'$. The more exact function of the circuit is now explained below.

The input pilot signal $f_I$ is a whole multiple of the input frame clock $f_R$ and its frequency lies significantly higher than that of the frame clock. The output signal $f_E$ of the input divider DI1 must be a whole multiple of the input frame clock. The divider DI1 is synchronized such by the frame clock $f_R$ that an exactly defined time interval always exists between the signal edges of the input frame clock $f_R$ and the following signal edge of the signal $f_E$ at the output of the divider DI1. In addition to defining the selection of the phase detector and of the limit frequency of the phase locked loop, the division factor of the input divider DI1 also defines the jitter compatibility and the lock-on behavior of the circuit.

At this point, however, let it be emphasized that the input divider DI1 can also be omitted, whereby the input frequency $f_E$ of the phase detector PHD is then equal to the input pilot signal $f_I$.

The frequency of the voltage-controlled oscillator VCO is selected higher than the output frequency $fa$ in order to keep the individual phase boosts slight in the setting events. The controlled divider DI2 generates the phase detector comparison signal $f_2$ from the output signal $f_0$ of the voltage-controlled oscillator VCO. By means of pulses from the frame clock phase detector RPD, this controlled divider DI2 can be reset to a division factor that is higher or lower by 1. Given, for example, a division factor of 64, a pulse $I_H$ sets the division factor to 65 for one cycle, in contrast whereto a pulse $I_L$ sets the division factor to 63 for one cycle. In order to compensate these variations, the output frequency following an $I_H$ pulse must be briefly higher in order to compensate the phase difference at the phase detector PHD. Given an $I_L$, pulse, in contrast, the output frequency of the voltage-controlled oscillator VCO must be briefly lower.

The divider DI3 generates the output frequency $f_a$ from the frequency $f_0$ of the voltage-controlled oscillator VCO. However, this divider can also be potentially omitted if the output frequency $f_a$ is allowed to be higher than the input frequency.

The actual control of the frame clock synchronization ensues with the assistance of the frame clock phase detector RPD. The synchronization thereby ensues in two sub-steps. In the first sub-step, a check is carried out with the assistance of the phase discriminator PD1 to see whether the phase deviation of the output frame clock $f_R'$ compared to the rated position is less than the maximally possible difference jitter at the phase detector PHD. The phase discriminator PD1 can supply three different output information, namely:

a) the phase deviation is less than the maximum difference jitter;

b) the phase deviation is greater than the maximum difference jitter and the phase is leading; and c) the phase deviation is greater than the maximum difference jitter and the phase is trailing.

In cases b) and c), the logic unit STE generates $I_H$ or, respectively, $I_L$ pulses in order to reduce the phase deviation of the output frame clock $f_R'$. In case a), the phase discriminator PD2 is also utilized for further control, this utilizing the two signals $f_E$ and $f_4$ that do not jitter relative to one another for the comparison. These two signals have the same frequency and also have the same phase position at the rated position of the output frame clock. Here, too, different output situations can occur, namely:

$a_1$) The phase position coincides.

$a_2$) The phase is leading, and $a_3$) the phase is trailing.

In cases $a_2$) and $a_3$), the logic unit generates pulses $I_H$ or, respectively, $I_L$ in order to reduce the phase deviation between the signals $f_E$ and $f_4$ and, thus, the phase deviation of the output frame clock $f_R'$ until it becomes 0. In the case a1, however, no pulses are generated, and the phase deviation is 0.

For the more detailed description of the invention, an input clock and output clock of the pilot signals $f_I$ and $f_a$ of 2.048 MHz is assumed, as are an oscillator frequency of the controlled oscillator of 16.384 MHz and an input signal $f_E$ of the phase detector PHD of 256 kHz, whereby an EX-OR phase detector is employed and the condition is set that the input frame clock $f_R$ is identical in phase with the output frame clock $f_R'$.

The input divider DI1 divides the input frequency by 8, and it can be realized with a 3-bit counter without synchronous load input. The input pilot signal $f_I$ serves as counting clock, and the control or, respectively, synchronization by the input frame clock $f_R$ is intended to effect that its output signal $f_E$ has a defined phase position compared to the input frame clock $f_R$, for example 90° compared to the leading edge of $f_R$. In this case, a load pulse having the width of the cycle duration of $f_I$ is generated synchronous with the leading edge of the 8 kHz frame clock and the load value is transferred into the counter with the next clock edge.

Figure 3:
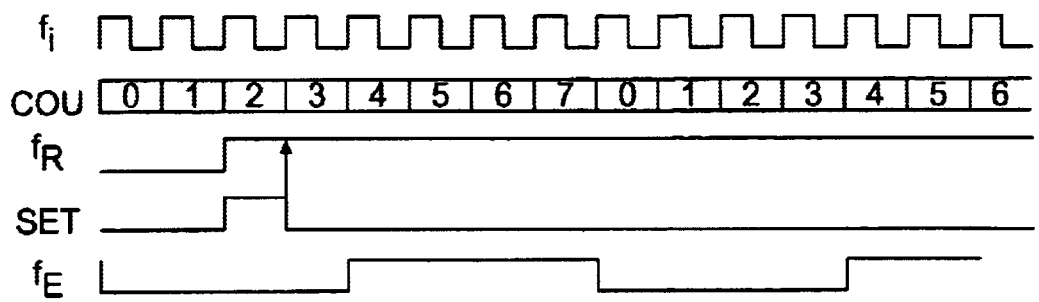
FIGS. 3–6 show diagrams of clock sequences at various points according to the present invention.

FIG. 3 shows the control case of the executive sequence wherein the value COU of the divider DI1 is raised by 1 with every leading edge of the input pilot signal $f_I$ when the signal SET is at 1. As shown, the signal SET is generated, for example, by an AND operation of the frame clock signal $f_R$ with the frame clock signal that is delayed by one clock cycle of the input signal $f_I$ and inverted. When the signal SET is at H, the pre-set load value—3 in this case—is accepted by the divider DI1 with the leading edge of the input signal $f_I$. As a result of this setting, the leading edge of the input frame clock $f_R$ is placed into the middle of an L region (90° shift) of the signal $f_E$. In this phase position of the input frame clock $f_R$ compared to the input signal $f_E$ of the phase detector PHD, the load event does not effect any change in the numerical sequence compared to the normal counting cycle. Given an undisturbed input signal, this phase position—once it has been set—is always maintained since the signal $f_E$ is a whole multiple of the input frame clock $f_R$. After a signal disturbance, however, the relative phase position can have changed; however, the correct relationship is restored after the first set pulse. The phase relationship can be arbitrarily set in the spacing of the cycle duration of the input pilot signal $f_I$ on the basis of other load values.

The controlled divider DI2 divides the output frequency $f_0$ of the voltage-controlled oscillator VCO onto the comparison frequency $f_2$, whereby $f_2 = f_E$[applies] in the locked-in condition and the relative phase position of the two signals is dependent on the type of phase detector. Given an EX-OR phase detector, a relative phase position of 90° occurs. Whether the two signal lead or trail one another is dependent on the pull-in characteristic of the combination filter FIL-voltage-controlled oscillator VCO (rising or dropping frequencies with increasing phase detector voltage).

For dividing the output frequency $f_0$ of the voltage-controlled oscillator VCO onto the comparison frequency $f_2$, a division factor of 64 is required in the present case. Given an $I_L$ pulse output by the logic unit STE, the division factor is set to 63 for one pass, as a result whereof the time between two edges of the signal $f_2$ is shortened by 61 ns and the frequency of the signal $f_2$ becomes higher for one cycle. An individual $I_L$ pulse effects a phase shift of the signal $f_2$ relative to the signal $f_E$ by 61 ns. When the equilibrium condition was set before this pulse, then the phase locked loop attempts to achieve its condition again after this pulse. To this end, the frequency of the voltage-controlled oscillator VCO is briefly lowered until the 61 ns are compensated and the original phase condition is restored at the phase detector. The transient duration of the phase locked loop is determined by its inherent time constant.

The divider DI3 with a division factor of 8 that follows the voltage-controlled oscillator VCO divides the oscillator clock of 16.384 MHz onto the output frequency $f_a$ with 2.048 MHz.

Figure 4:
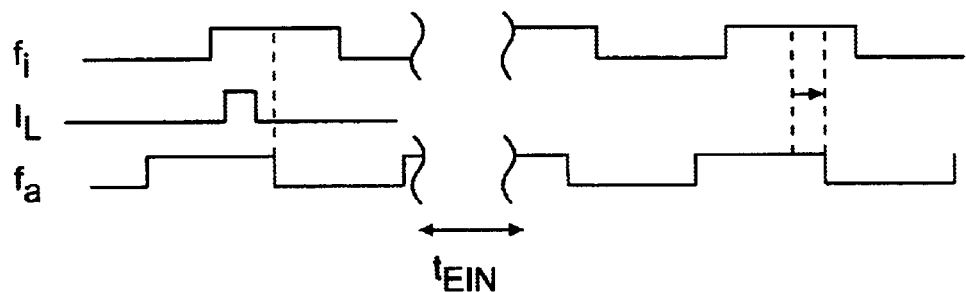

As can be derived from FIG. 4, wherein the transience is referenced $T_{ein}$, the phase position of $f_a$ relative to the input pilot signal $f_I$, after a pulse $I_L$ at the controlled divider D2 shifts by +61 ns with the time constant of the phase locked loop. Stated more precisely, the spacing of the edges of the output signal $f_a$ from the preceding edges of the input pilot signal $f_I$ increases, which is indicated by an arrow at the right in FIG. 4.

Figure 5:
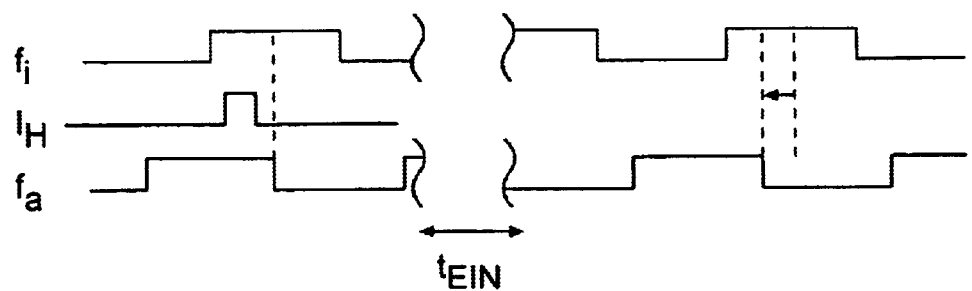

After a pulse IH output from the logic unit STE to the controlled divider DI2, the phase position of the output signal $f_a$ relative to the input signal $f_I$ shifts by −61 ns with the time constant of the phase locked loop. Stated more precisely, the spacing of the edges of the output signal $f_a$ from the preceding edges of the input signal $f_I$ decreases, which is shown in FIG. 5 analogous to FIG. 4.

The output divider DI4 with a division ratio of 256 in this example generates the 8 kHz output frame clock $f_R'$ from the output clock $f_a$. In order to assure an exact phase relationship, it is advantageous to implement the divider as a synchronous divider, whereby the output signal $f_0$ of the voltage-controlled oscillator VCO is supplied to it as synchronization signal.

Since the input frame signal $f_R$ is connected to the input pilot signal $f_I$ via a fixed division ratio, which is similarly true of the output frame clock $f_R'$ and of the output signal $f_a$, a time shift of the output signal $f_a$ relative to the input pilot signal $f_I$ effects an identical time shift of the output frame clock $f_R'$ relative to the input frame clock $f_R$.

After a pulse $I_L$ at the controlled divider DI2, the phase position of the output frame clock $f_R'$ relative to the input frame clock $f_R$ shifts by +61 ns with the time constant of the phase locked loop, whereby the spacing of the edges of the output frame clock $f_R'$ from the preceding edges of the input frame clock $f_R$ increases.

In an analogous way, the phase position of the output frame clock $f_R'$ relative to the input frame clock $f_R$ shifts by −61 ns with the time constant of the phase locked loop after a pulse $I_H$ at the controlled divider D2, whereby the spacing of the edges of the output frame clock $f_R'$ from the preceding edges of the input frame clock $f_R$ decreases. As already mentioned, auxiliary clocks $f_4$, $f_{4, f4}'$ and $f_4''$ that are shifted in time compared to the output frame clock $f_R$ are also generated by the output divider DI4 in addition to the output frame clock $f_R'$. The shift is dependent on the rated phase position of the input frame clock to the output frame clock and on the definition range of the phase detector. The clock $f_4$ has the same nominal frequency as the output clock $f_2$ of the controlled divider DI2 and has a rigid phase relationship to the output frame clock $f_R'$.

The edges of the signals $f_2$, $f_4$, $f_4'$, $f_4''$ and $f_R'$ always lie exactly in a 61 ns time grid that is determined by the output frequency $f_0$ of the voltage-controlled oscillator VCO. This also reveals the advantage of a high oscillator frequency, 16.384 MHz in the present case. A pulse $I_H$ or $I_L$ from the logic unit STE effects an immediate shift of the edges of the signal $f_2$ by 61 ns relative to the edges of the signals $f_R'$, $f_4$, $f_4'$.

Figure 6:
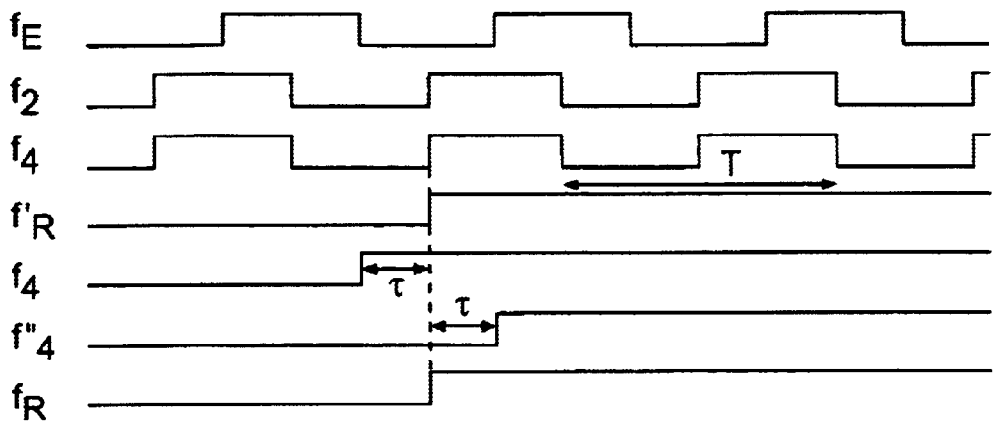

The frame clock phase detector RPD implements the phase comparison on the frame clock level, thus on the 8 kHz level here. The rated condition of the phase relationships for seven signals considered here is shown in FIG. 6. When an EX-OR phase detector is employed, $f_E$ and $f_2$ are phase-shifted by exactly 90° relative to one another in the steady, disturbance-free state.

In the present example, the divider DI1 was defined such with respect to the phase position of the frame clock that the leading edge of the frame clock $f_R$ lies exactly in the middle of an L range of $f_E$. In the steady-state and disturbance-free mode, the leading edge of the frame clock $f_R$ coincides with a leading edge of the output signal $f_2$ of the divider DI2. The edges of the signals $f_2$ and $f_4$ should likewise coincide. It was also defined here that, as already mentioned, input and output frame clock should be identical in phase in the disturbance-free state. The leading edge of the output frame clock $f_R'$ thus coincides with the leading edge of $f_2$. This relationship between $f_2$ and $f_R'$ is preserved as long as the phase locked loop works error-free and no $I_L$ or $I_H$ pulse is generated. Given a jittering input signal, the output clock attempts to follow the jitter movement of the input clock. Dependent on the jitter frequency and the parameters of the phase locked loop, however, the jitter of the output clock is more and more suppressed with increasing jitter frequency. As a result thereof, a difference jitter arises between the input pilot signal $f_I$ and the output signal $f_a$ that, with reference to the time. occurs in the same size between the signal $f_E$ and $f_2$. This jitter likewise occurs between the input and the output frame clock $f_R$ and $f_R'$.

The difference jitter causes a deviation of the input signals of the phase detector PHD from their rated phase position, and this difference is referred to as difference phase. As long as this jitter does not become so great that the difference phase exceeds the unambiguous range of the phase detector, the phase locked loop remains locked in. Given an EX-OR phase detector, the unambiguous range is $\pm\Pi$, whereby the linearity range with $\pm\Pi/2$ still lies within this range. The phase locked loop behaves linearly within the linearity range and the allowable difference phase is usually limited with $\pm\Pi/2$.

The two output clocks $f_4'$ and $f_4''$ of the output divider DI4 are shifted such compared to the output frame clock $f_R'$ that the edges represent the limits of the allowable difference phase transferred onto the frame clock frequency. In the example, this should be the linearity range; however, the range can be stretched to just barely below the unambiguous range. Given a valid input clock wherein the jitter lies within the allowable limits, the leading edge of the input frame clock $f_R$ lies after the leading edge of the signal $f_4'$ and before the leading edge of the signal $f_4''$.

Figure 2B:
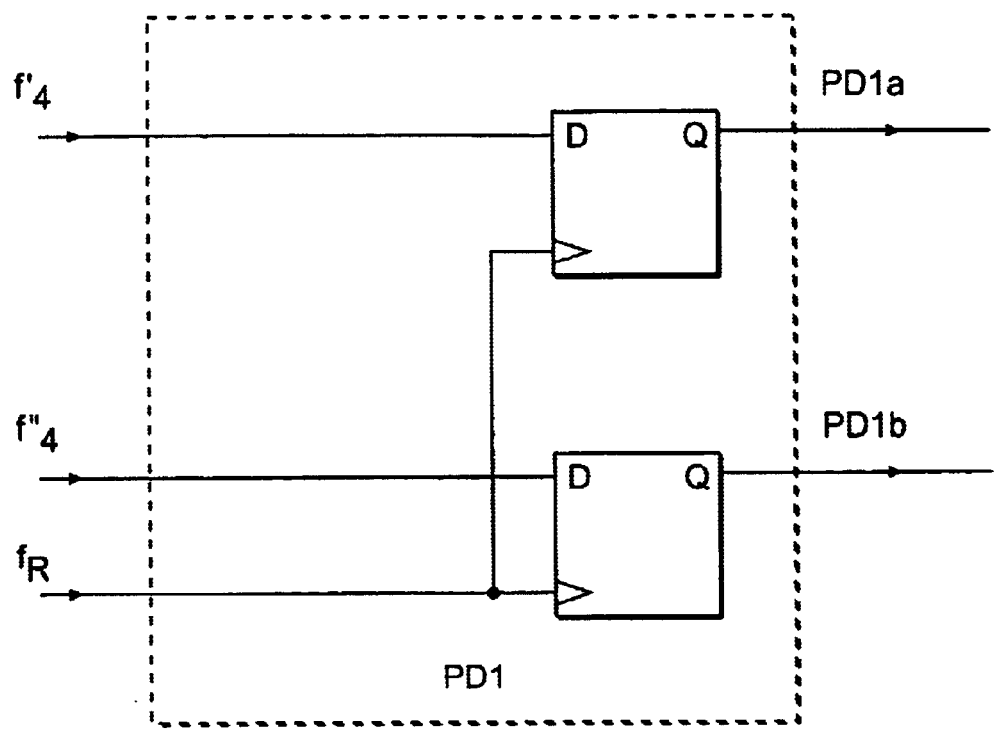
FIGS. 2b–2d how details of the apparatus for frame clock synchronization according to the present invention.
Figure 2C:
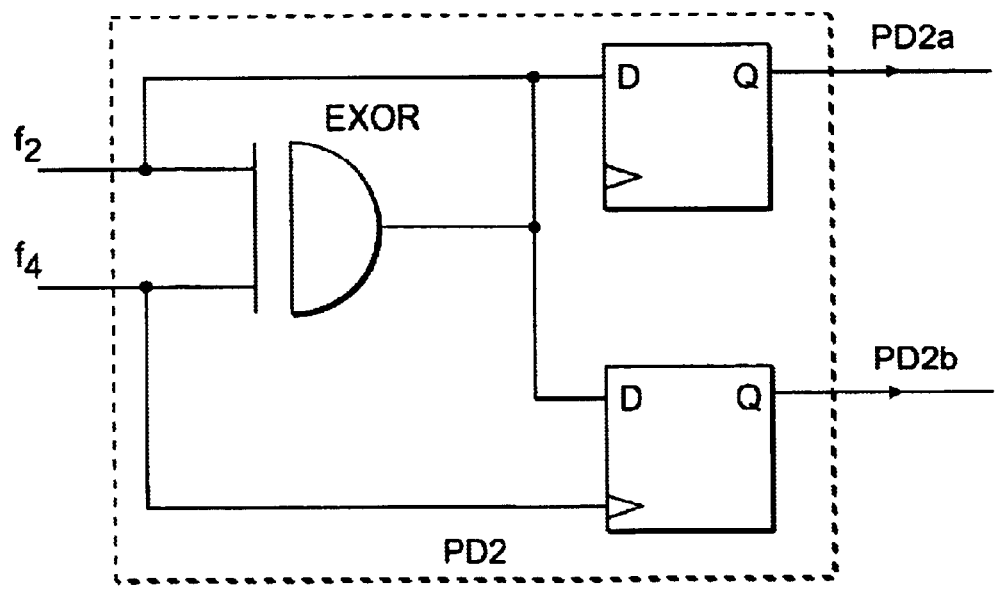
Figure 2D:
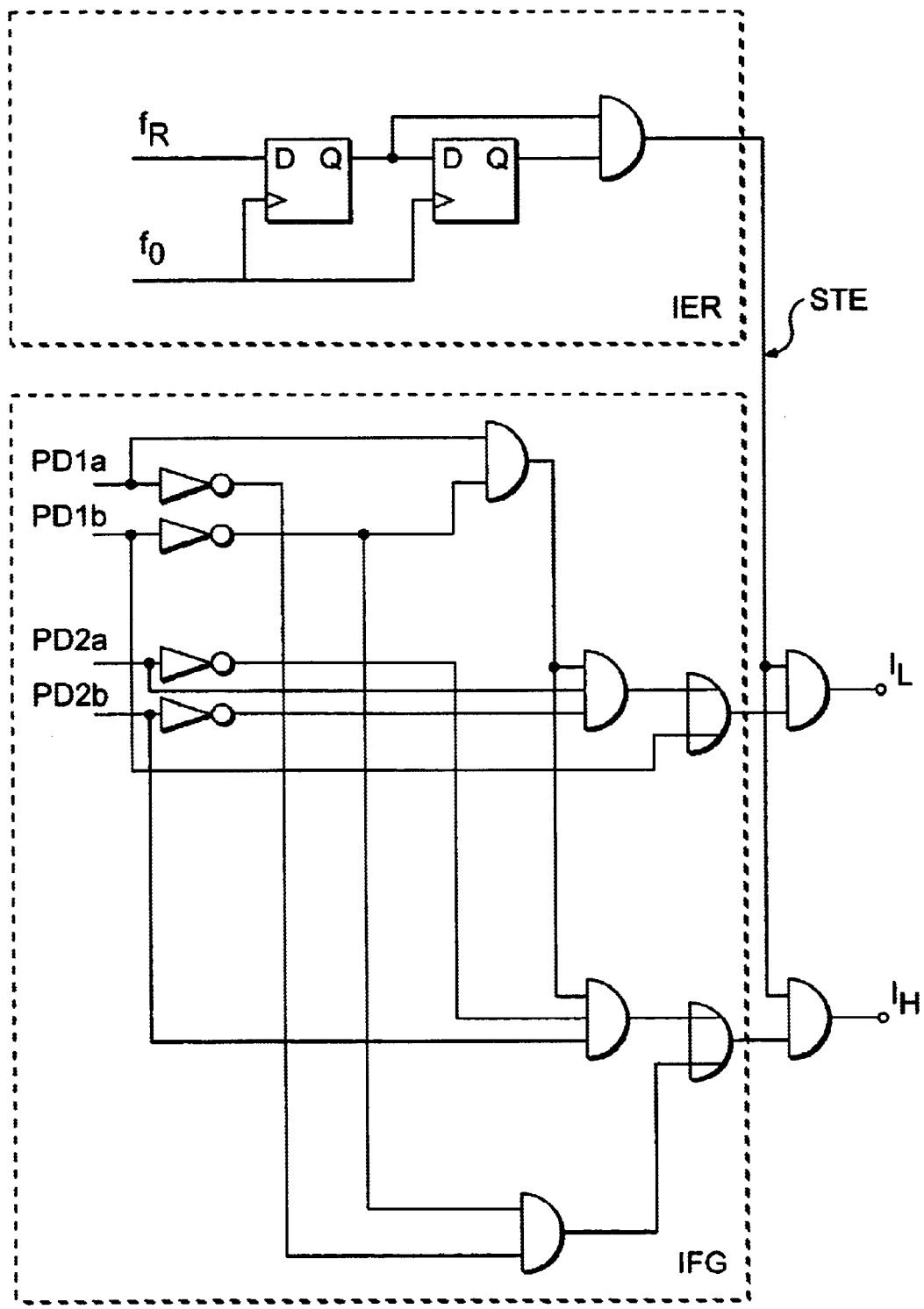

FIGS. 2b, 2c and 2d show possible embodiments of the two phase discriminators PD1, PD2 as well as of the logic unit STE. Thus, it should be clear that other detail solutions are available to a person skilled in the art with the scope of the disclosure of the invention.

The phase discriminator PD1 is composed of two D-flip flops whose clock input is driven by the input frame clock $f_R$. The signals $f_4'$ or, respectively, $f_4''$ are adjacent at the D-inputs of these flip flops, and the two Q-outputs of the D-flip flops form the output of the phase discriminator PD1 and lead to the logic unit STE. The output of that D-flip flop at whose D-input the signal $f_4'$ is adjacent will always indicate an H condition. An L condition will always be present at the output at any D-flip flop at whose D-input the signal $f_4''$ is adjacent. Only when the phase shift between the input and the output frame clock $f_R$ or, respectively, $f_R'$ becomes greater than defined by the mutual edge spacing of the two signals $f_4'$ and $f_4''$ are both D-outputs of the flip flops at L given a leading input frame clock $f_R$, but both D-outputs of the flip flops are at H given a trailing input frame clock $f_R$. The direction of the correction measures is therefore also determined by the status LL or, respectively, HH at the output or, respectively, at the outputs of the phase discriminator PD1. The status LH can also occur instead of the status HL given very large phase deviations between input and output frame clock close to 180°, whereby the direction of the correction measures is irrelevant in this case since the same number of correction steps are required in both directions.

The phase discriminator PD2 also has two outputs, whereof the first output supplies, for example, H-pulses when the signal $f_2$ leads compared to the signal $f_4$ and the second output supplies H-pulses when $f_2$ trails. No pulses occur given phase equality. Since the phase spacings can only be whole multiples of the cycle duration of the output signal $f_O$ of the voltage-controlled oscillator VCO, the pulse duration of the output signals is also quantize in this grid.

The possible output states of the phase discriminator PD1 are shown in tabular form below and then discussed.

| PD1 a | PD1 b | Action |
|---|---|---|
| L/O | 0 | signal $f_R$ before $f_R'$; $I_H$ pulses must be generated |
| H/1 | 0 | rated condition |
| H | H | signal $f_R'$ before $f_R$; $I_L$ pulses must be generated |
| 0 | H | phase shift nearly 180°; the status can be handled like LL or HH. Subsequently like HH here. |

When, instead of the status HL at the output of the phase discriminator PD1, an HH, LL or LH status occurs or pulses appear at one of the outputs of the phase discriminator, then this can have the following causes:

1) The phase locked loop is disengaged, whereby this condition can be identified with a lock-in detector of a traditional type. The reaction to this error is application-dependent and can be comprised, for example, in a shutoff of the outputs or switching to a different synchronous input or in a transition to a "hold-over" or"free-run".

2) The phase locked loop is engaged but the jitter of the input signal exceeds the defined, allowable range. As a result thereof, the signal does not meet the demands and should not be employed for synchronization. Such a great sinusoidal jitter produces alternating HH, HL and LL sequences insofar as the jitter does not have the frequency of the input frame clock or a whole multiple thereof. The great jitter amplitudes that occur in practice, however, are usually aperiodic and significantly lower in frequency.

3) After elimination of a signal of function disturbance, the phase locked loop is locked in again but the phase relationships no longer agree. In this case, the phase synchronization is implemented as described.

Figure 7A:
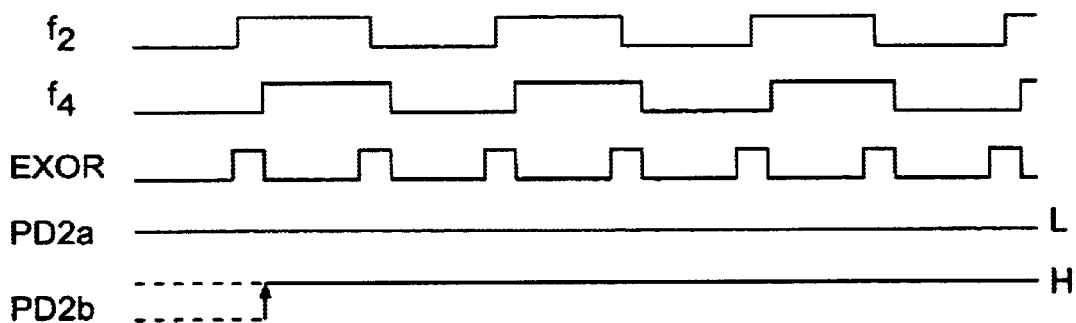
FIGS. 7a & 7b show other diagrams of clock sequences at various points according to the present invention.
Figure 7B:
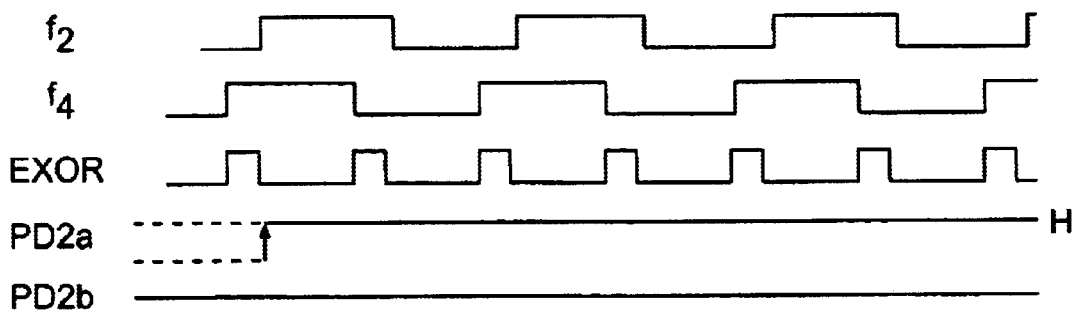

A possible initial situation for the case described under 3) is shown in FIGS. 7a and 7b. Since a locked-in and steady state is assumed, the signals $f_E$ and $f_2$ are again phase-shifted by exactly 90° relative to one another. Differing from FIG. 6, however, the edge of the output frame clock $f_R'$ does not coincide with an edge of $f_2$. As a result of the rigid phase relationships of the output frame clock $f_R'$ to the signals $f_4$, $f_4'$ and $f_4''$, these clocks are also shifted compared to the status of FIG. 6. Fundamentally, the output clocks $F_4'$, $F_4''$ can be shifted relative to the clock $F_R'$ by an arbitrary multiple of the cycle duration $1/f_O$ of the voltage-controlled oscillator VCO. The leading edge of the input frame clock $f_R$ again lies exactly in the middle of an L region of the signal $f_E$, since the rigid phase relationship is also guaranteed here. Given a steady-state phase locked loop, the leading edge of the input frame clock $f_R$ again coincides with a leading edge of the signal $f_2$. Although this condition is stable, it does not correspond to the phase condition for the frame clock.

The signal $f_4$ continues to be phase-rigid with respect to the output frame clock $f_R'$ but not necessarily the same in phase as the signal $f_R'$. In contrast to the situation shown in FIG. 6, the leading edge of the input frame clock $f_R$ now lies in a range wherein both the signal $f_4'$ as well as $f_4''$ are in an H-status, and, accordingly, the phase discriminator PD1 supplies the condition HH at its output.

The method for phase correction between the input frame clock $f_R$ and the output frame clock $f_R'$ now sequences as described below.

When the output of the phase discriminator PD1 supplies the value HH, the logic unit STE generates $I_L$ pulses until, at the leading edge of the input frame clock $f_R$, the signal $f_4'$ still has the condition H but the signal $f_4''$ has already reached the condition L and the output of the phase discriminator PD1 again supplies the status HL.

When the output of the phase discriminator PD1 supplies the value LL, the logic unit STE generates $I_H$ pulses until, at the leading edge of the input frame clock $f_R$, the signal $f_4''$ still has the status L but the signal $f_4'$ has already reached the status H and the output of the phase discriminator PD1 again supplies the status HL.

When the status LH is present at the output of the phase discriminator PD1, either $I_L$ or $I_H$ pulses are selectively mixed in until the status HH or LL is reached.

The pulse repetition rate with which $I_L$ or, respectively, $I_H$ pulses are mixed in is dependent on the allowable frequency deviation that is defined by standards and system parameters dependent on the application.

When, following such an event, the status HL is reached, the phase coincidence is not yet present. As long as the phase discriminator PD2 stills supplies pulses, the rated condition has not been reached and $I_L$ or, respectively, $I_H$ pulses must continue to be mixed in dependent on which of the outputs supplies pulses. The final condition is only reached when the phase discriminator PD2 no longer supplies any pulses.

It is critical for the circuit of the logic unit STE described in FIG. 2d that T <T/4 applies (see FIG. 6). The status HH of the phase discriminator PD2 then need not be considered, since the status HL is not reached at the phase discriminator PD1. The following picture derives in tabular form for the status HL at the output of the phase discriminator PD1:

| PD2a | PD2b | Action |
|------|------|--------|
| L | L | correct phase relationship; actions are not initiated; |
| L | H | the edge of $f_2$ arrives before the edge of $f_4$; $I_H$ pulses must be generated; |
| H | L | the edge of $f_4$ arrives before the edge of $f_2$; $I_L$ pulses must be generated; |
| H | H | this status does not occur for T < T/4 when the phase discriminator PD1 is in the condition HL. |

The output signals of PD2 are not further-processed when the output of PD1 is not in the condition HL.

The phase relationship between the input frame clock $f_R$ and the output frame clock $f_R'$ can be arbitrarily designed within a time grid that is defined by the oscillator frequency f0 of the voltage-controlled oscillator VCO, and the setting speed is determined by the selection of the pulse repetition rate of the $I_L$ or, respectively, $I_H$ pulses.

Although preferred embodiments of the invention have been described herein, it is to be understood that the invention is not limited to these embodiments and that various changes and modifications thereto may be made without departing from the scope and spirit of the invention, which is to be defined by the following claims.

What is claimed is:

1. A circuit for synchronizing a frame clock in a data transmitting system, the circuit comprising a phase detector having at least two inputs and an output connected to the input of a voltage-controlled oscillator via a filter, at least one input of the phase detector is supplied with a clock derived from the data transmitted by the system and at least another input is supplied with an output signal of a voltage-controlled oscillator conducted over a divider such that the clock exhibits a multiple clock frequency compared to the frame clock; the divider comprises a variable divider having a variable division factor, and is connected to a frame clock phase detector for setting the division factor; the frame clock phase detector is supplied with the frame clock, the output signal of the variable divider and at least one clock signal of an output divider that divides the output signal of the voltage-controlled oscillator into an output frame clock; and the frame clock phase detector is configured for the output of a pulse that temporarily one of raises or lowers the division factor of the divider dependent on the maximum phase jitter of the clocks when the frame clock and the output frame clock deviate.

2. The circuit according to claim 1, wherein the frame clock phase detector comprises a first phase discriminator and a second phase discriminator, the first phase discriminator is supplied with the input clock and two output clocks of the output divider phase-shifter relative to one another, the second phase discriminator is supplied with the output clock of the controlled divider and an output clock of the output divider, such that, the outputs of the phase discriminators are conducted to the controlled divider via a logic unit for driving the controlled divider.

3. The circuit according to claim 2, wherein the first phase discriminator comprises two D-flops, for each of which, clock inputs are supplied with the frame clock, D-inputs are supplied with the two phase-shifted output signals of the output divider, and Q-outputs are supplied to the logic unit.

4. The circuit according to claim 3, wherein the second phase discriminator has two outputs that are supplied to the logic unit, the second phase discriminator is configured to output pulses at one of the two outputs only when the clocks supplied to it lead or trail on another.

5. The circuit according to claim 4, wherein the output clocks of the output divider are phase-shifted relative to one another by a definable, allowable difference in phase with respect to the frame clock and the output frame clock.

6. The circuit according to claim 5, wherein the output frame clock of the output divider is shifted relative to the two mutually phase-shifted output clocks of the divider by a multiple of the cycle duration of the voltage-controlled oscillator.

7. The circuit according to claim 6, wherein the division factor of the controlled divider can be one of raised or lowered by 1.

8. The circuit according to claim 7, wherein the frequency of the output signal of the voltage-controlled oscillator is a multiple of the frequency of the output clock, such that a divider divides the oscillator output clock onto the output clock.

9. The circuit according to claim 8, wherein the output divider for the frame clock is a synchronous divider to which the output signal of the controlled oscillator is supplied as a synchronization signal.

10. The circuit according to claim 9, wherein the phase detector is preceded by an input divider.

11. The circuit according to claim 10, wherein the input divider is a synchronous divider synchronized by the input frame clock.

* * * * *